United States Patent [19]
Matsubara et al.

[11] Patent Number: 5,976,626
[45] Date of Patent: *Nov. 2, 1999

[54] SEMICONDUCTOR DEVICE AND METHOD OF MANUFACTURING THEREOF

[75] Inventors: Junko Matsubara; Toru Tajima; Shigeru Harada, all of Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/691,043

[22] Filed: Aug. 1, 1996

[30] Foreign Application Priority Data

Aug. 23, 1995 [JP] Japan ................................ 7-214798

[51] Int. Cl.⁶ ........................................................ B05D 3/04
[52] U.S. Cl. ........................ 427/307; 428/195; 427/309; 501/92; 438/769; 438/782; 438/787; 438/788
[58] Field of Search ...................... 438/769, 782, 438/787, 788; 428/195; 427/307, 309; 501/92

[56] References Cited

U.S. PATENT DOCUMENTS

| | | |
|---|---|---|
| 4,676,868 | 6/1987 | Riley et al. . |
| 4,983,546 | 1/1991 | Hyun et al. . |
| 5,003,062 | 3/1991 | Yen . |
| 5,189,502 | 2/1993 | Gomi . |
| 5,457,073 | 10/1995 | Ouellet . |
| 5,459,086 | 10/1995 | Yang . |
| 5,518,962 | 5/1996 | Murao ................................. 438/782 |

FOREIGN PATENT DOCUMENTS

| | | |
|---|---|---|
| 0559394 A2 | 9/1993 | European Pat. Off. . |
| 60-235711 | 11/1985 | Japan . |
| 60-235711 A2 | 11/1985 | Japan . |
| 5-121572 | 5/1993 | Japan . |
| 5-121572 A2 | 5/1993 | Japan . |
| 6-16410 A2 | 1/1994 | Japan . |
| 6-112191 A2 | 4/1994 | Japan . |
| 6-267937 | 9/1994 | Japan . |

OTHER PUBLICATIONS

Hideo Namatsu et al., "The Effect of Plasma Cure Temperature on Spin–On–Glass", J Electrochem. Soc., vol. 140, No. 4, Apr. 1993, pp. 1121–1125.

Harland G. Tompkins et al., "Desorption from Spin–On Glass", J. Electrochem. Soc., vol. 136, No. 8, Aug. 1989, pp. 2331–2335.

Michio Niwano et al., "Ultraviolet–Induced Deposition of $SiO_2$ Film from Tetraethoxysilane Spin–Coated on Si," J. Electrochem. Soc., vol. 141, No. 6, Jun. 1944, pp. 1556–1561.

Shri Ramaswami et al., "Etchback Planarization Employing a Sacrificial Glass Layer," Motorola, Inc., Technical Developments, vol. 12, Apr. 1991, p. 172.

Chul Woo Nam et al., "Characterization of spin–coated silicate and phosphosilicate thin films prepared by the sol–gel method," Thin Solid Films, 237 (1994), pp. 314–319.

Primary Examiner—Melvyn I. Marquis
Attorney, Agent, or Firm—McDermott, Will & Emery

[57] ABSTRACT

A method of manufacturing a semiconductor device is provided superior in planarization, crack resistance, and moisture resistance, and with no corrosion in wiring while the manufacturing cost is suppressed without increasing the number of manufacturing steps in forming an interlayer film therein. This method includes the step of forming a silicon oxide film on a substrate so as to cover a first wiring formed with a silicon oxide film therebetween. A thick-film inorganic SOG film is coated on the silicon oxide film, and then a thermal treatment is applied. Next, a silicon oxide film is formed, and a via hole is formed according to a predetermined mask. By carrying out a thermal treatment at the temperature of 150~550° C. and at the pressure of not more than $10^{-3}$ Torr with a portion of the thick-film inorganic SOG film exposed at a side surface of the via hole, residual gas such as $CO_2$, and $H_2O$ adsorbed to the side surface of the via hole is released. Thus, corrosion of a wiring that is subsequently formed will be prevented to obtain a semiconductor device of high reliability.

18 Claims, 17 Drawing Sheets

SEMICONDUCTOR DEVICE AND METHOD OF MANUFACTURING THEREOF

BACKGROUND OF THE INVENTION

1. Field of the Invention

The present invention relates to a semiconductor device and a method of manufacturing the same, and more particularly, to a semiconductor device having a planarized interlayer insulator film between, beneath, or above metal wirings, and a method of manufacturing the same.

2. Description of the Background Art

In these few years, reduction in the difference in underlayer level and planarization of an insulator film between wirings have become one of the most critical processes in improving the yield and reliability of semiconductor devices corresponding to increase in the density and integration thereof. One of such processes includes the step of depositing a film by a spin-on-glass method with silicon polymer (referred to as "SOG film" hereinafter) and applying a thermal treatment.

The material to form an SOG film (referred to as "SOG material" hereinafter) is classified into two types, i.e., inorganic SOG material, and organic SOG material having a structure in which an alkyl group is directly bonded to silicon.

When difference in underlayer level is to be reduced using an inorganic SOG material, a step of applying an inorganic SOG film 5a on an underlying oxide film 4 as shown in FIG. 24, and a step of applying again an inorganic SOG film 5b for the sake of planarization as shown in FIG. 25 are required. The inorganic SOG film filling the space between the stepped portion receives a tensile stress due to shrinkage of the film at the time of film growth to result in a generation of a crack 20.

When an SOG film is used as a part of a passivation film on a metal wiring, this crack will adversely affect the moisture resistance. For example, a crack 21 is easily generated beneath the stepped portion of a silicon nitride film 11 formed on a metal wiring by plasma CVD as shown in FIG. 26. Although SOG film 5b is applied over the stepped portion, generation of another crack 20 in this SOG film 5b will degrade the moisture resistance in addition to crack 21 in silicon nitride film 11 to result in corrosion of metal wiring 7.

In contrast, there is an advantage that difference in underlayer level can be reduced by virtue of using an organic SOG film 5c as shown in FIG. 27 since a film of approximately 1.5 $\mu$m in maximum thickness can be formed just by one coating.

This organic SOG material includes alkyl groups such as Si—$CH_3$ and Si—$C_2H_5$, which can be easily damaged by oxygen plasma. There is a problem that dry etching 22 occurs when a crack or peeling 23 of the film is generated in an etching step of a via hole as shown in FIG. 28.

A structure in which organic SOG film 5c is not exposed at the side surface of a via hole is therefore required. More specifically, overall etchback is carried out after applying a coat of organic SOG film 5c to remove the organic SOG film above the stepped portion as shown in FIG. 29. A structure in which organic SOG film 5c is not exposed at the side surface of a via hole is possible as shown in FIG. 30 by this additional process.

An inorganic SOG film that can be formed in greater thickness than a conventional inorganic SOG film (referred to as "thick-film inorganic SOG film" hereinafter) is a new material for solving the above-described problems of conventional SOG film. Japanese Patent Laying-Open No. 5-121572 discloses an example of the material of a thick-film inorganic SOG film according to the formula of:

$l=1\sim3$, $m=0\sim1$ $n=20\sim25000$

According to this disclosure, an interlayer insulator film including a silicon polymer of the above formula is deposited on a first metal wiring 3, which is then subjected to an etching process of a via hole 24 as shown in FIG. 31 to form a second metal wiring 7 as shown in FIG. 32.

Here, the coated and baked silicon polymer expands as a structure of SiON or $SiO_2$. Therefore, crack resistance is improved by generation of a residual compressive stress in the film to increase densification of the film.

According to this process, side etching and generation of a crack can be suppressed. However, after formation of via hole 24, gas such as $H_2O$ and $CO_2$ is generated from the SOG film at the side surface of the via hole in forming the second metal wiring. Second metal wiring 7 is corroded by the generated gas to cause the defective phenomenon of the so-called poisoned via. This phenomenon is similarly encountered in structure 27 employing a conventional inorganic SOG film and also in structure 26 employing an organic SOG film as shown in FIG. 34.

When planarization of an insulator film between wiring and reduction in the difference in underlayer layer are to be effected in a semiconductor device using the conventional inorganic SOG material, a multi-layer must be formed by multi-coating. This will increase the number of manufacturing steps and the cost. Furthermore, there is a problem that a crack is generated caused by shrinkage of the film during its growth to affect the reliability of the device such as moisture resist and the like.

When a conventional organic SOG material is used, there is a problem that the exposed surface of the organic SOG film is side-etched or a crack generated to cause wiring defection.

Even when a thick-film inorganic SOG material which is an improved version of the above-described two types of SOG material is used, the gas from the exposed surface of the thick-film inorganic SOG film at the side surface of a via hole causes wiring corrosion termed poisoned via to degrade the reliability of the device.

SUMMARY OF THE INVENTION

In view of the foregoing, one object of the present invention is to provide a semiconductor device that has superior crack resistance and moisture resistance to avoid wiring defect without increasing the number of manufacturing steps and cost even when a thick-film inorganic SOG material is used.

Another object of the present invention is to provide a method of manufacturing thereof.

A method of manufacturing a semiconductor device according to an aspect of the present invention includes the step of depositing an inorganic film by the spin-on-glass method on a semiconductor substrate, and then applying a thermal treatment in an ambient of nitrogen, air, or water vapor at a temperature of 300–500° C. to form an interlayer film.

According to this manufacturing method, the interlayer film can be increased in thickness than a conventional inorganic SOG film.

Furthermore, difference in underlayer level can be reduced by just one coating process and crack resistance can be improved.

A method of manufacturing a semiconductor device according to another aspect of the present invention includes the step of depositing an interlayer film including an inorganic film formed by the spin-on-glass method on a semiconductor substrate, and the step of forming an opening in the interlayer film to expose the inorganic film at the side surface of the opening, and then applying a thermal treatment at a vacuum of not more than $10^{-3}$ Torr and at a temperature of 150–550° C.

According to the present manufacturing method, the gas adhering to the inorganic film at the side surface can be released by a thermal treatment at a temperature of 150–550° C. and in vacuum of not more than $10^{-3}$ Torr.

A metal wiring formed thereafter will not be corroded at an opening.

A method of manufacturing a semiconductor device according to a further aspect of the present invention includes the step of depositing an inorganic film by the spin-on-glass method on a semiconductor substrate, and directing nitrogen plasma onto the inorganic film.

According to the present manufacturing method, the upper layer portion of the film can be nitrided by directing nitrogen plasma to the upper surface of the inorganic film.

Since the inside of the inorganic film is protected by the nitride surface, the crack resistance can further be improved.

A method of manufacturing a semiconductor device according to still another aspect of the present invention includes the step of depositing an inorganic film by the spin-on-glass method on a semiconductor substrate, and then directing ultraviolet ray on the inorganic film.

According to the present manufacturing method, the inorganic film can be converted into $SiO_2$ by irradiation of the inorganic film with ultraviolet ray.

Therefore, the crack resistance can further be improved.

As the material of an inorganic film formed by the spin-on-glass method, a first silicon material represented by the formula of:

where x=1~3, y=3~1, and

R is hydrogen atom or lower alkyl group or a second silicon material represented by the formula of:

l=1~3, m=0~1
n=20~25000
can be applied.

The method of manufacturing a semiconductor device according to the present aspect includes the step of applying a thermal treatment to form an interlayer film after the inorganic film is formed using the above-described first and second silicon material. Therefore, the crack resistance can be improved and the thickness of the interlayer film can be increased.

Thus, difference in underlayer level can easily be reduced and reliability of the device such as moisture resistance can be improved.

According to an aspect of the present invention, a semiconductor device includes an inorganic film formed using a first silicon material represented by the formula of:

where x=1~3, y=3~1, and

R is hydrogen atom or lower alkyl group or a second silicon material represented by the formula of:

l=1~3, m=0~1
n=20~25000.

By applying the above-described thermal treatment to the inorganic film, desorption gas corresponding to the mass number of 18, 22 and 44 was not substantially observed by thermal desorption spectroscopy (TDS).

According to the another aspect of the present invention, a semiconductor device includes an inorganic film formed using a first silicon material represented by the formula of:

where x=1~3, y=3~1, and

R is hydrogen atom or lower alkyl group or a second silicon material represented by the formula of:

l=1~3, m=0~1
n=20~25000.

Regarding the inorganic film to which ultraviolet ray was directed, infrared absorption corresponding to the bonding of a silicon atom and a hydrogen atom at the wave number of 2000–2040 $cm^{-1}$ and infrared absorption corresponding to the bonding of a nitrogen atom and a hydrogen atom at the wave number of 3200–3600 $cm^{-1}$ were not substantially observed in infrared absorption spectrometry.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A first embodiment of the present invention using an SOG material will be described with reference to the drawings.

The SOG material used in the present invention is called "thick-film inorganic SOG material", and has a bond of an inorganic group such as Si—H and Si—N with silicon. The SOG material includes a first SOG material represented by the formula of:

$$S_i H_x (OR)_y$$

where $x=1\sim3$, $y=3\sim1$, and

R is hydrogen atom or lower alkyl group or a second SOG material represented by the formula of:

$l=1\sim3$, $m=0\sim1$
$n=20\sim25000$.

Since the Si—H bond is not easily broken in this thick-film inorganic SOG material in comparison with that of the conventional inorganic SOG material of a Si—OH bond, the crack resistance by an internal stress was improved to approximately 1.3~2.0 times. Therefore, the thickness can be increased than in a conventional inorganic SOG film by just one coating.

Figure 1:
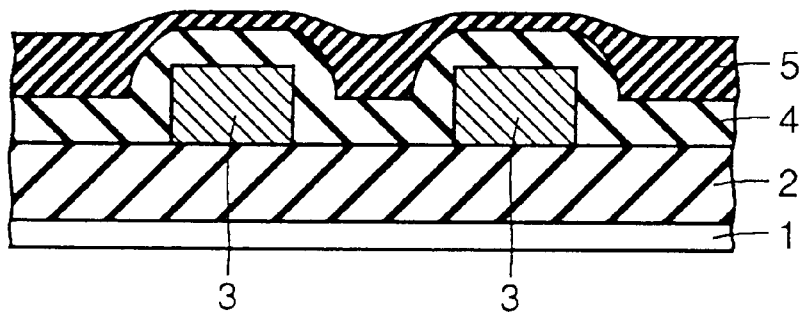
FIGS. 1 and 2 are sectional views of a semiconductor device showing one step of a manufacturing method thereof according to first and second embodiments, respectively, of the present invention.

Referring to FIG. 1, a thick-film inorganic SOG film 5 is applied by spin-coating on an underlying oxide film 4, followed by removal of the solvent. Then, a thermal treatment is carried out in a sinter chamber at a temperature range of 300~550° C. in an appropriate ambient such as $N_2$, $H_2O$, $O_2$, and the like.

As to this thermal treatment, the speed of inserting/drawing out the semiconductor device into/from the sinter chamber is desirably not more than 10 cm/min in order to improve the crack resistance. Furthermore, the temperature when the semiconductor device is inserted or drawn out to and from the sinter chamber is preferably 30~100° C. lower than the actual processing temperature.

In fact, a crack was observed in the SOG film of 5000 Å in thickness when the temperature in inserting/drawing out the semiconductor device was identical to that of the actual processing temperature. However, generation of the crack in the SOG film could be prevented by lowering the temperature when the semiconductor device is inserted or drawn out to and from the chamber by 30~100° C. than the actual processing temperature.

Furthermore, a crack was observed in the SOG film of 7000 Å in thickness when the semiconductor device was inserted or drawn out to or from the chamber at 15 cm/min. In contrast, generation of a crack in the SOG film could be suppressed by lowering the speed to 10 cm/min.

Since difference in underlayer level can be reduced and crack resistance improved by applying the SOG material once, reliability of the semiconductor device can be improved and the number of manufacturing steps will not be increased. Therefore, the manufacturing cost can be suppressed.

Second Embodiment

A second embodiment of the present invention will be described hereinafter.

Figure 2:
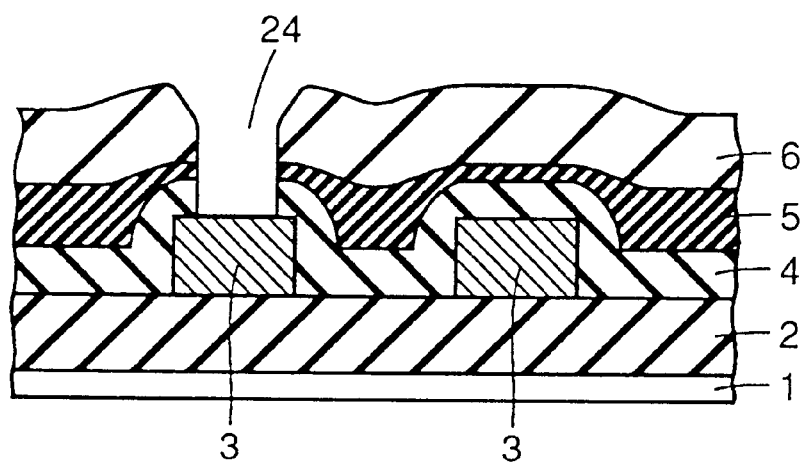

As shown in FIG. 1, following formation of a thick-film inorganic SOG film on underlayer oxide film 4, a silicon oxide film 6 is formed by plasma CVD as shown in FIG. 2. A via hole is patterned using a predetermined mask. Then, anisotropic etching is carried out to form a via hole 24.

Figure 3:
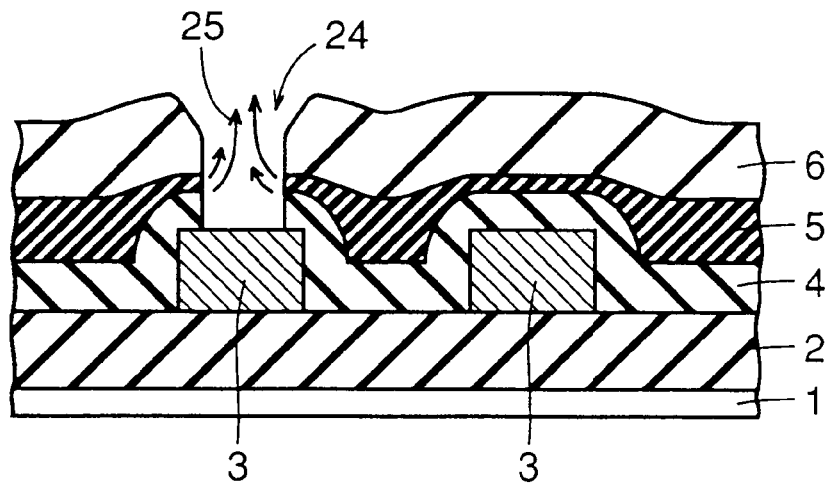
FIG. 3 is a sectional view of a semiconductor device showing a step carried out after the step of FIG. 2 according to the second embodiment of the present invention.

Then, a thermal treatment is carried out at a low pressure of not more than $10^{-3}$ Torr and at a temperature range of 150–550° C. with the thick-film inorganic SOG film partially exposed at the side surface of the via hole as shown in FIG. 3. By this thermal treatment, residual gas 25 such as $CO_2$, $H_2O$, and the like attached to portion of the SOG film at the side surface of the via hole and the adsorbed water are released.

Figure 4:
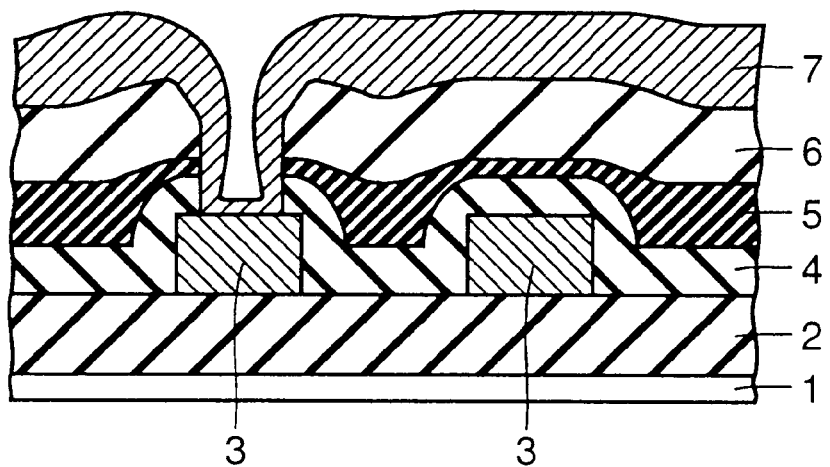
FIG. 4 is a sectional view of a semiconductor device showing a step carried out after the step of FIG. 3 according to the second embodiment of the present invention.

Following the thermal treatment, a second wiring 7 is formed in series as shown in FIG. 4 to prevent impurities from being attached again to the sidewall of the via hole.

The temperature range for the thermal treatment was obtained by the following experiment. More specifically, the amount of degas was evaluated by TDS (Thermal-Desorption-Spectroscopy) with a portion of the thick-film inorganic SOG film exposed through the opening of the via hole. The result of an example applying a first SOG material is shown in FIG. 5.

Figure 5:
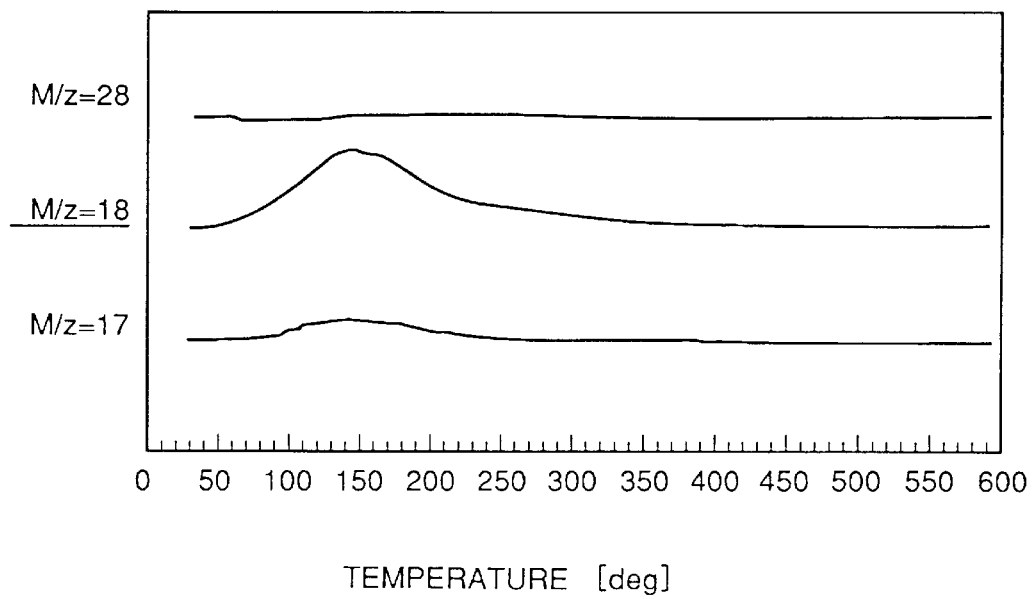
FIG. 5 is a graph showing degas evaluation results of an SOG film according to TDS of the second embodiment of the present invention.

FIG. 5 shows the relationship between the temperature of the wafer and the mass number of the substance released from the wafer. It is appreciated from the graph of FIG. 5 that the amount of degassing of mass number 18, i.e. $H_2O$ is great and is emitted centered about 150° C.

Therefore, the lower limit temperature of the thermal treatment after formation of a via hole is desirably 150° C. The upper limit temperature is preferably 550° C. so that a metal wiring does not melt.

Figure 6:
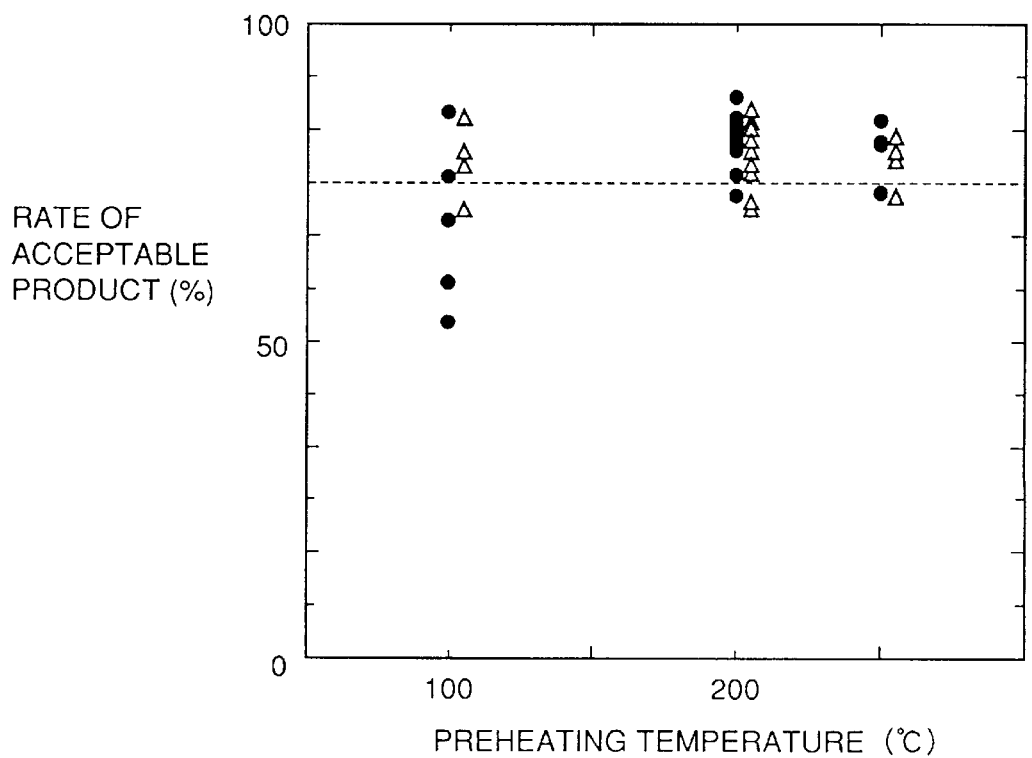
FIG. 6 is a graph showing the relationship between wafer yield and baking temperature according to the second embodiment of the present invention.

Furthermore, the dependency of the wafer yield on the temperature of the thermal treatment was evaluated. FIG. 6 shows the results. It is appreciated from FIG. 6 that variation in the yield is great when the thermal treatment temperature is 100° C., whereas the yield is high with low variation when the temperature is above 200° C.

Corrosion of metal wiring can be prevented by applying a thermal treatment at low pressure to effect degassing even in a structure where a thick-film inorganic SOG film is exposed through a via hole when the thick-film inorganic SOG film is applied between metal wirings. Thus, a semiconductor device can be obtained stably with a high yield.

Third Embodiment

A third embodiment of the present invention will be described hereinafter.

Figure 7:
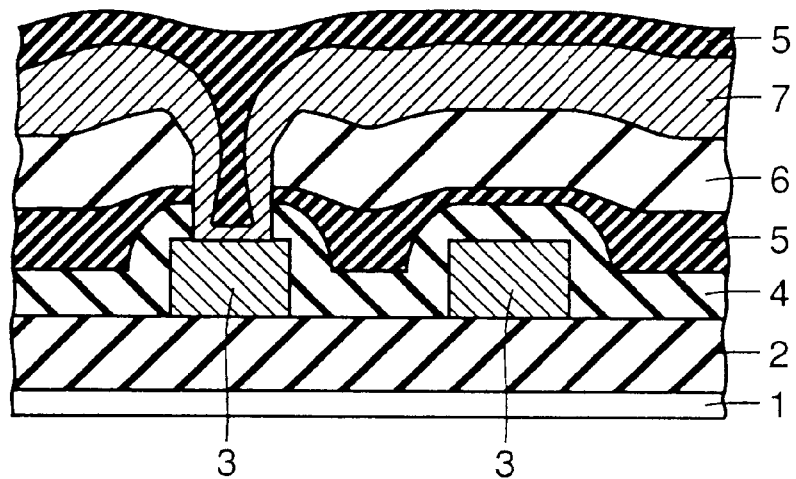
FIG. 7 is a sectional view of a semiconductor device showing one step of a manufacturing method thereof according to a third embodiment of the present invention.
Figure 8:
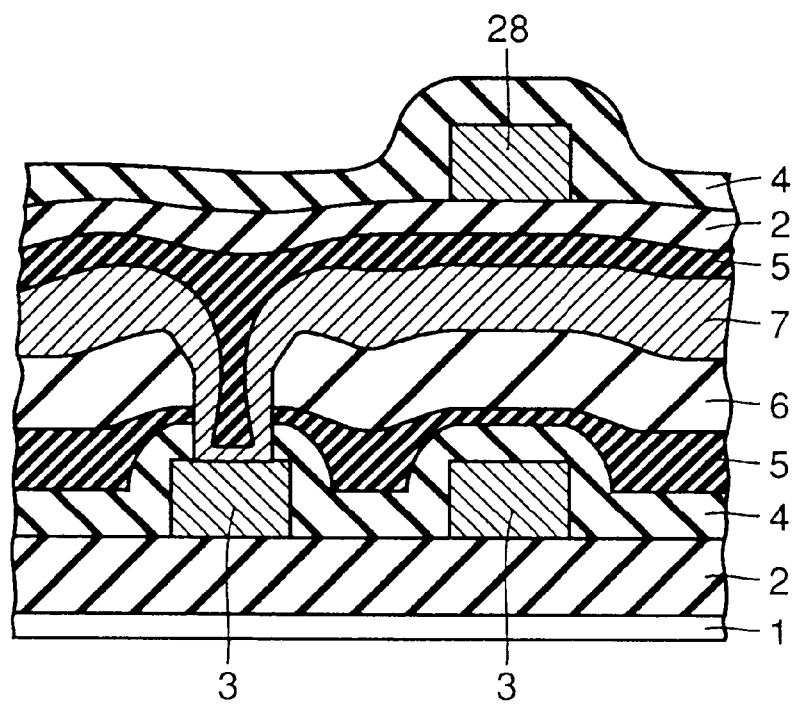
FIG. 8 is a sectional view of a semiconductor device showing a step carried out after the step of FIG. 7 according to the third embodiment of the present invention.

As shown in FIG. 7, thick-film inorganic SOG film 5 is applied on a second wiring 7, and subjected to a thermal treatment to fill a via hole. Then, a silicon oxide film 2 is deposited by plasma CVD and a third wiring 28 is formed as shown in FIG. 8. A silicon oxide film 4 is then deposited so as to cover third wiring 28.

By repeating similar steps, a multi-layer wiring structure of three or more layers can be formed.

By applying a thick-film inorganic SOG film, difference in underlayer level can be reduced and a via hole can be filled. Therefore, a multi-layer wiring can be formed easily to improve the integration density of a device.

Fourth Embodiment

A method of nitriding an SOG film to further improve crack resistance will be described hereinafter as the fourth embodiment.

Figure 9:
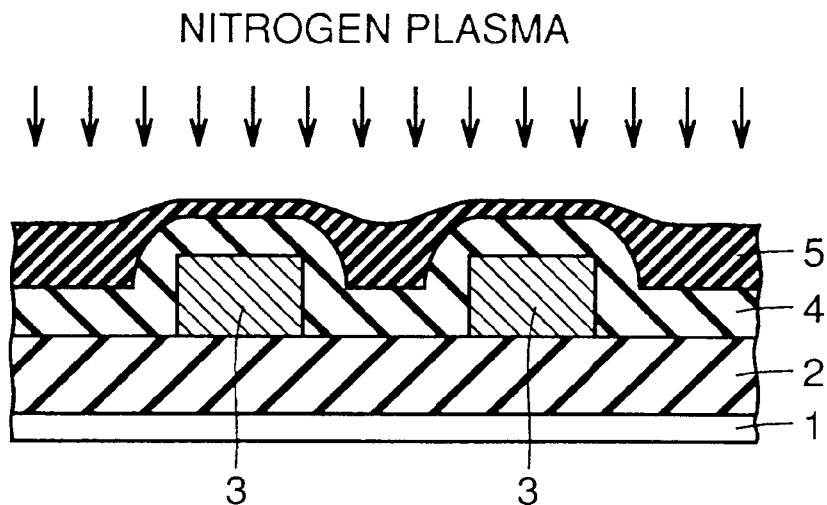
FIG. 9 is a sectional view of a semiconductor device showing a step of a manufacturing method thereof according to a fourth embodiment of the present invention.
Figure 10:
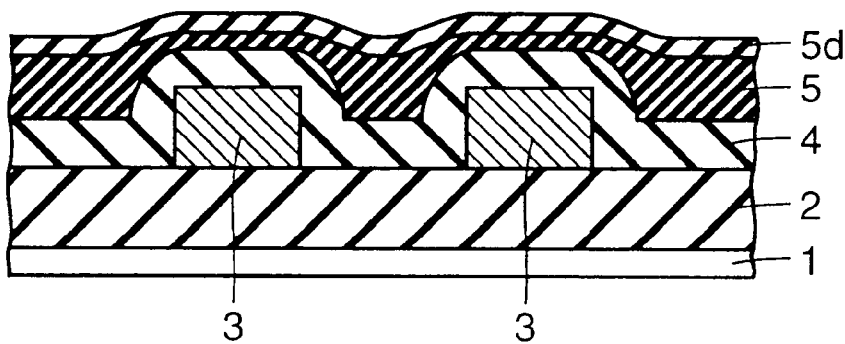
FIG. 10 is a sectional view of a semiconductor device showing a step carried out after the step of FIG. 9 according to the fourth embodiment of the present invention.

As shown in FIG. 9, a silicon oxide film 4 is formed by plasma CVD so as to cover first wiring 3, and then thick-film inorganic SOG film 5 is applied.

Then, nitrogen plasma is directed onto the surface of SOG film 5 to obtain a nitrided surface 5d of SOG film 5.

Figure 11:
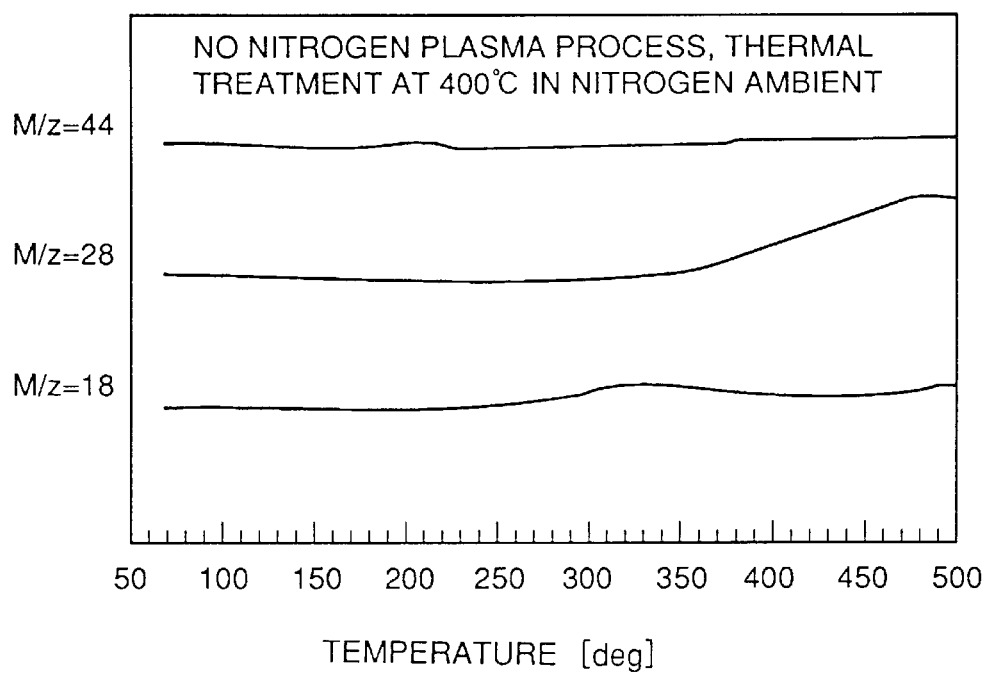
FIGS. 11 and 12 are graphs showing results of degas evaluation results of an SOG film according to TDS of the fourth embodiment of the present invention.
Figure 12:
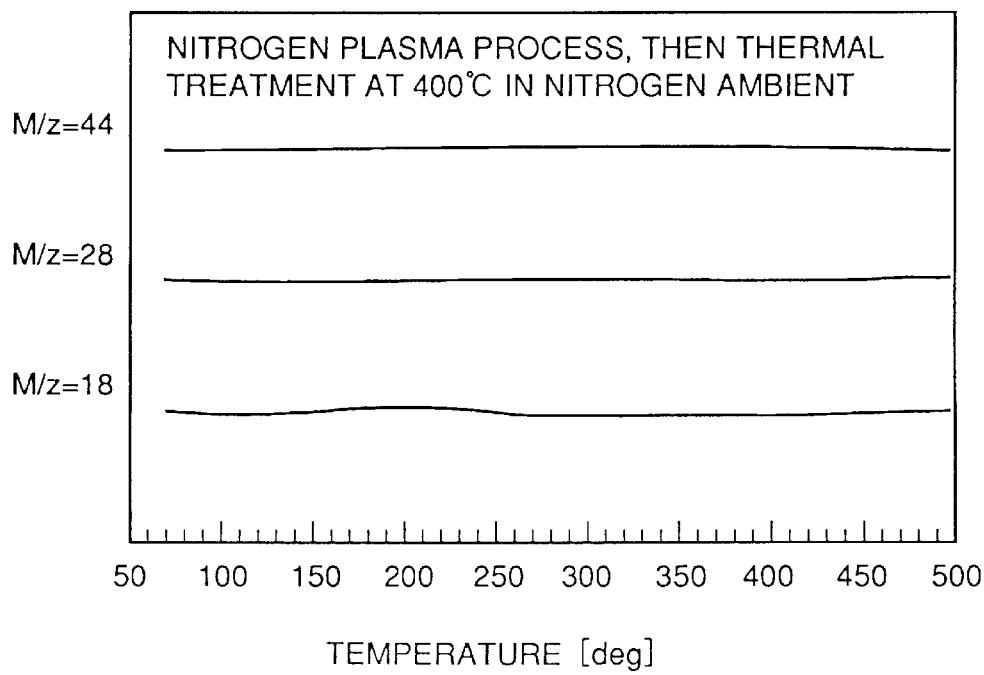

The amount of the degassing was evaluated by TDS depending upon the presence/absence of a nitrogen plasma process after applying a coat of a thick-film inorganic SOG film. The results are shown in the graphs of FIGS. 11 and 12. Here, the first SOG material was applied.

FIG. 11 is a graph showing the state where a nitrogen plasma process is not applied, and FIG. 12 shows the state where a nitrogen plasma process was applied. It is appreciated from FIG. 12 that almost no degassing was observed until the vicinity of 500° C. in the semiconductor device subjected to a nitrogen plasma process. This means that film breakdown is suppressed at the temperature below 500° C., and no film shrinking occurs. It is appreciated that crack resistance is improved by nitriding the proximity of the surface of the SOG film.

Furthermore, acceleration evaluation of crack resistance was carried out. A thick-film inorganic SOG film subjected to a nitrogen plasma process showed no generation of a crack even when a thermal treatment at 400° C. for 15 minutes in a nitrogen ambient was repeated for ten times. In contrast, a crack was observed in the thick-film inorganic SOG film not subjected to a nitrogen plasma process at the fourth time of the repeated thermal treatment.

Thus, by effecting a nitrogen plasma process after a thick-film inorganic SOG film is applied, a semiconductor device improved in crack resistance and having high reliability can be obtained.

Fifth Embodiment

A method of improving crack resistance by promoting the conversion of thick-film inorganic SOG film into $SiO_2$ will be described hereinafter as a sixth embodiment.

Figure 13:
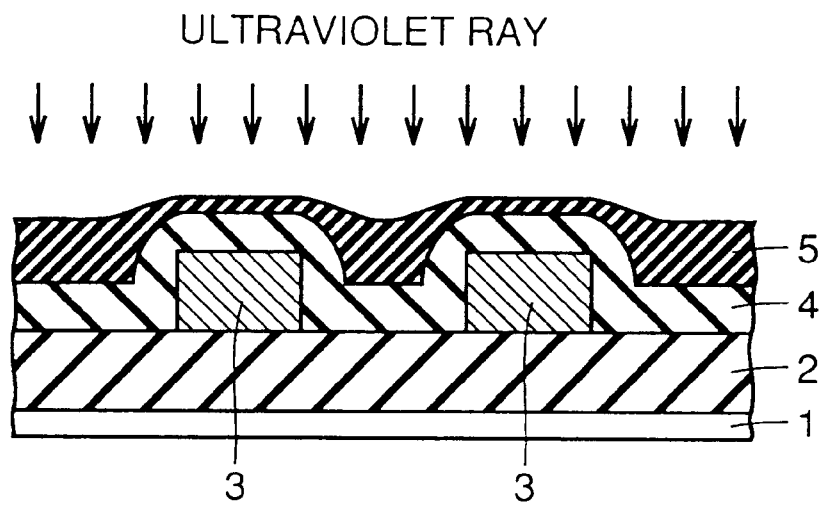
FIG. 13 is a sectional view of a semiconductor device showing a step of a manufacturing method thereof according to a sixth embodiment of the present invention.

As shown in FIG. 13, following formation of a silicon oxide film 4 by plasma CVD so as to cover first wiring 3, a thick-film inorganic SOG film 5 is applied. Then, ultraviolet ray is directed onto the surface of thick-film inorganic SOG film 5.

Figure 15:
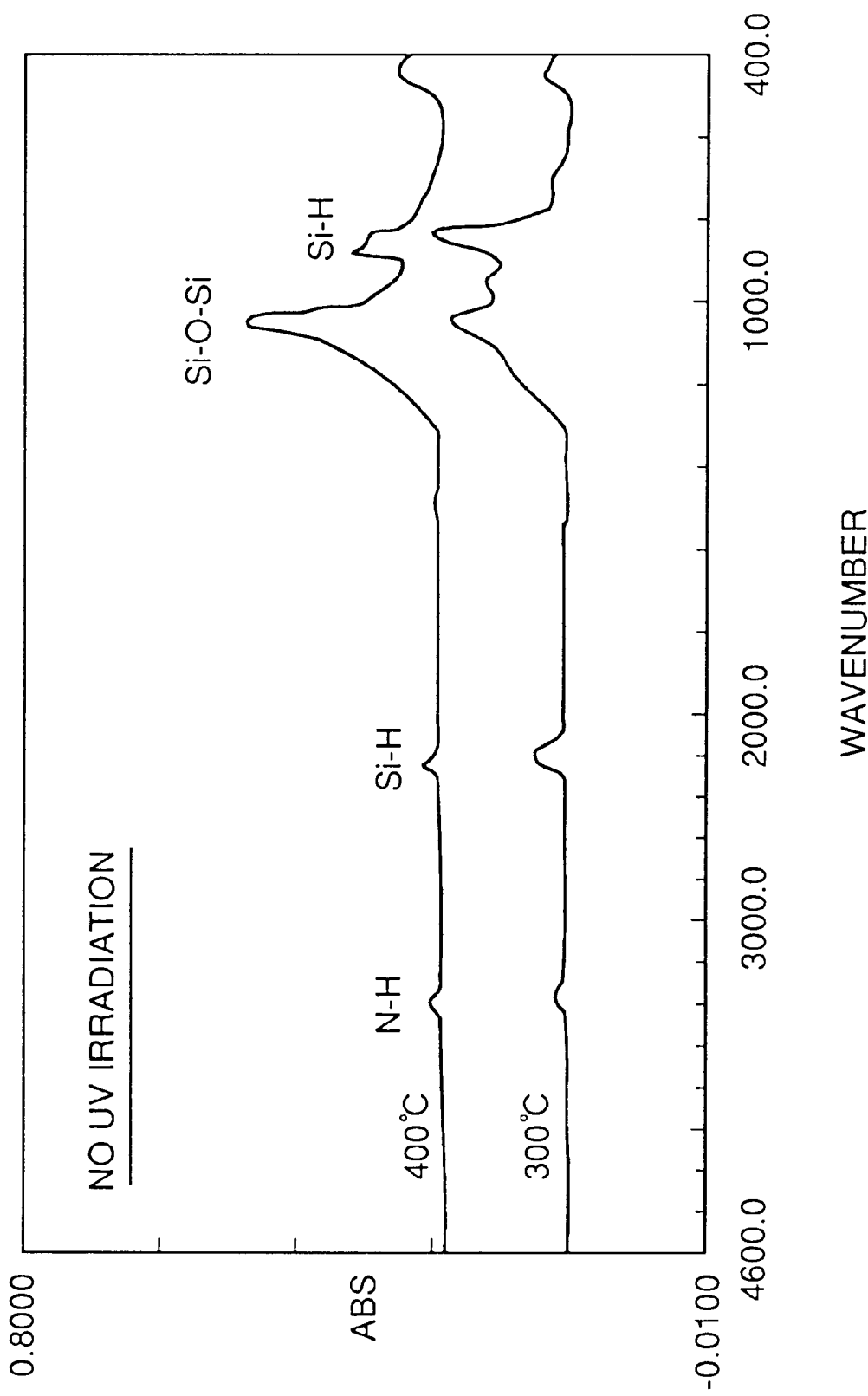
FIGS. 15 and 16 show an SOG film spectra by infrared absorption according to the fifth embodiment of the present invention.
Figure 16:
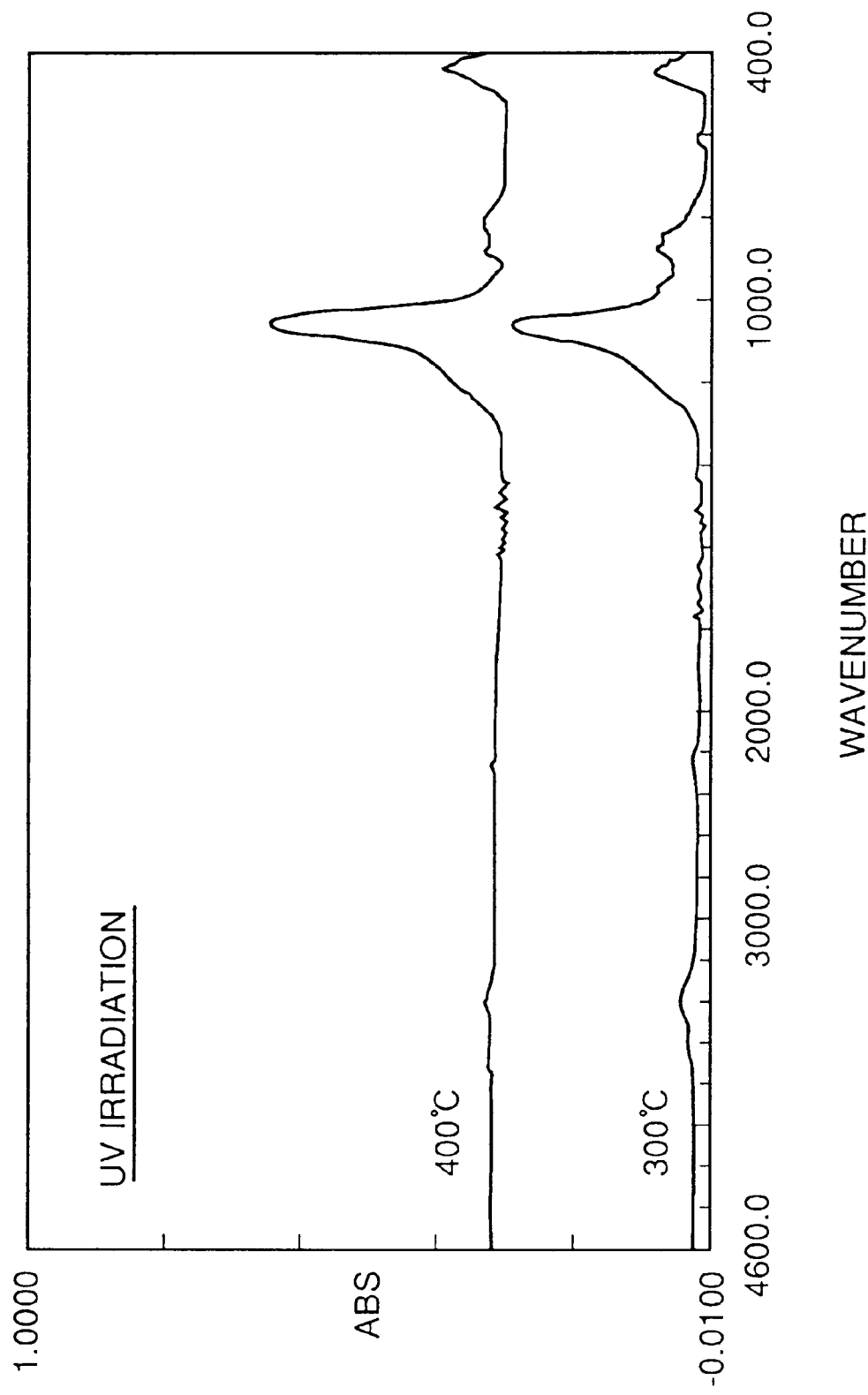

Here, difference in the conversion of $SiO_2$ within the thick-film inorganic SOG film depending upon whether ultraviolet ray is directed or not will be described (using the second SOG material) with reference to FIGS. 15 and 16. FIG. 15 shows an infrared absorption spectrum of an SOG film subjected to a thermal treatment at 300° C. or 400° C. with no irradiation of an ultraviolet ray after a thick-film inorganic SOG film is applied. FIG. 16 shows an infrared absorption spectrum of an SOG film subjected to a thermal treatment of 300° C. or 400° C. with an irradiation of an ultraviolet ray after a thick-film inorganic SOG film is applied.

It is found that a thick-film inorganic SOG film irradiated with an ultraviolet ray has an infrared absorption intensity corresponding to the bond of Si—O—Si greater than that of a thick-film inorganic SOG film not irradiated with an ultraviolet ray. It was appreciated that $SiO_2$ conversion was promoted.

Figure 14:
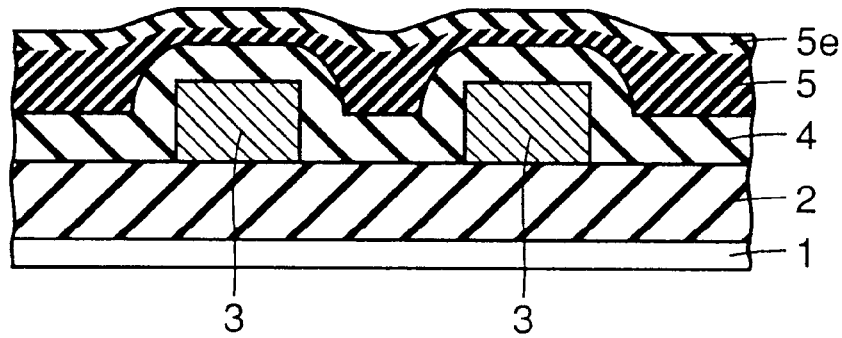
FIG. 14 is a sectional view of a semiconductor device showing a step carried out after the step of FIG. 13 according to the fifth embodiment of the present invention.

By directing an ultraviolet ray, an $SiO_2$ 5e conversion was promoted as shown in FIG. 14. Thus, a semiconductor device further improved in crack resistance and having high reliability can be obtained.

Improvement in the crack resistance of thick-film inorganic SOG film also serves to improve the moisture resistance.

Sixth Embodiment

A method of also using a passivation film will be discussed hereafter as a sixth embodiment.

Figure 17:
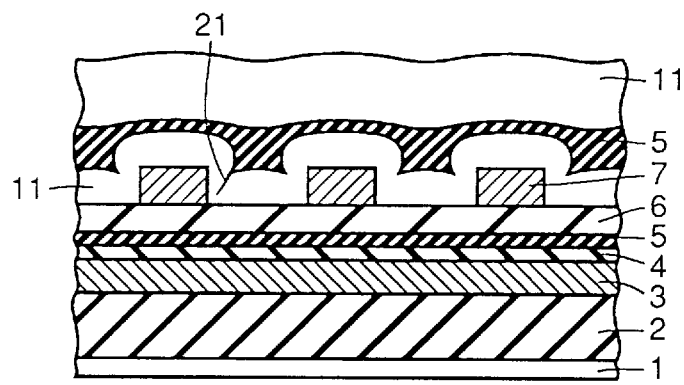
FIG. 17 is a sectional view of a semiconductor device showing a manufacturing step thereof according to a sixth embodiment of the present invention.

As shown in FIG. 17, a crack 21 is easily generated in the proximity of a stepped portion of a silicon nitride film 11 serving as a passivation film 11 formed on a metal wiring 7 by plasma CVD. However, introduction of water vapor or the like through this crack can be prevented by applying a thick-film inorganic SOG film on the silicon oxide film or silicon nitride and then applying a thermal treatment to block crack 21.

Thus, a semiconductor device improved in moisture resistance and having high reliability can be obtained.

Seventh Embodiment

A seventh embodiment of the present invention will be described hereinafter.

As described above, application of a thick-film inorganic SOG film is directly advantageous for preventing wiring corrosion, and improving crack resistance and planarization. Application of a thick-film inorganic SOG film also contributes indirectly to improvement of the electrical characteristics of a semiconductor device. When there is a dangling bond in an Si atom in a silicon type film excluding the thick-film inorganic SOG film, the hydrogen in the thick-film inorganic SOG film can serve to terminate the dangling bond by being coupled to the dangling bond. In other words, the thick-film inorganic SOG film becomes the hydrogen supply source for the dangling bond.

An SRAM (Static Random Access Memory) is known as one type of a memory device. A memory cell in such an SRAM is formed of a flipflop, including several types. One type is a TFT (Thin Film Transistor) that is a stable CMOS type cell, developed for the purpose of reducing the cell area.

Figure 18:
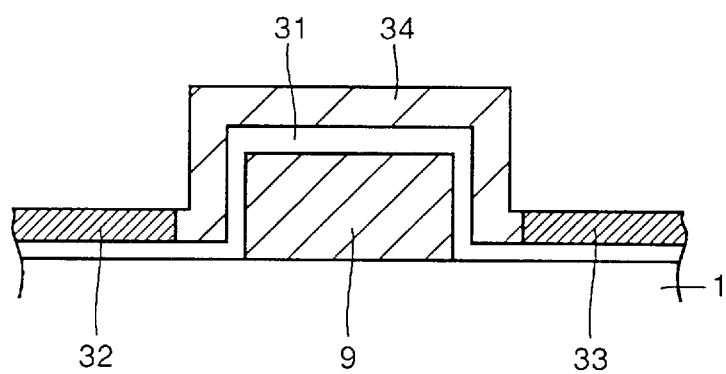
FIG. 18 is a sectional view of an SRAM at the proximity of TFT of a seventh embodiment of the present invention.
Figure 19:
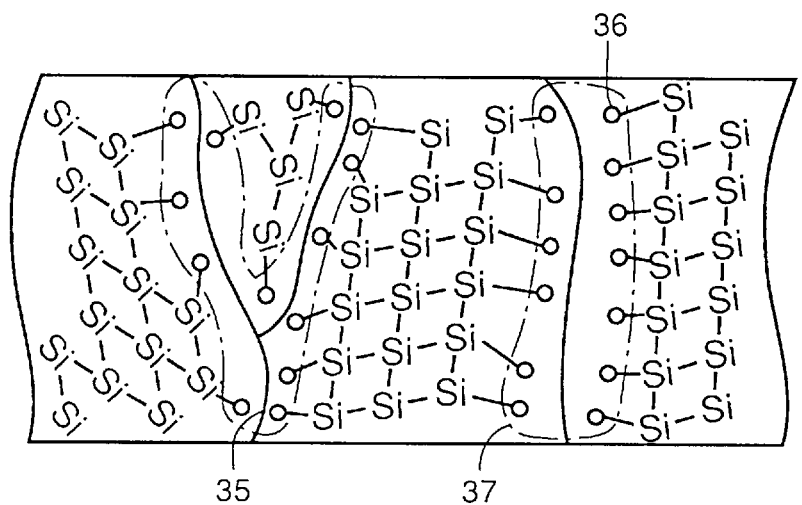
FIG. 19 shows the bonding state of silicon in polysilicon according to the seventh embodiment of the present invention.

FIG. 18 shows a sectional view of an example thereof. A TFT includes a channel region of a polysilicon 34 on a gate electrode 9 formed on a substrate 1 with a gate oxide film 31 therebetween, and a pair of source/drains 32 and 33 at both sides of gate electrode 9. Polysilicon 34 has a grain boundary 35 as shown in FIG. 19. A silicon dangling bond 36 is present at grain boundary 35 to form a mid gap level.

Carriers are trapped at this mid gap level, and other carriers are removed from grain boundary 35 to result in a depletion layer 37 to form a potential barrier. The ON current which is the source/drain current when the gate voltage attains the threshold voltage is reduced due to this potential barrier. Also, OFF current which is the source/drain current when the gate voltage is 0 V is generated as leakage current by thermal excitation via this level.

Therefore, a higher ON current and a lower OFF current are preferable as the electrical characteristics of the TFT.

Figure 20:
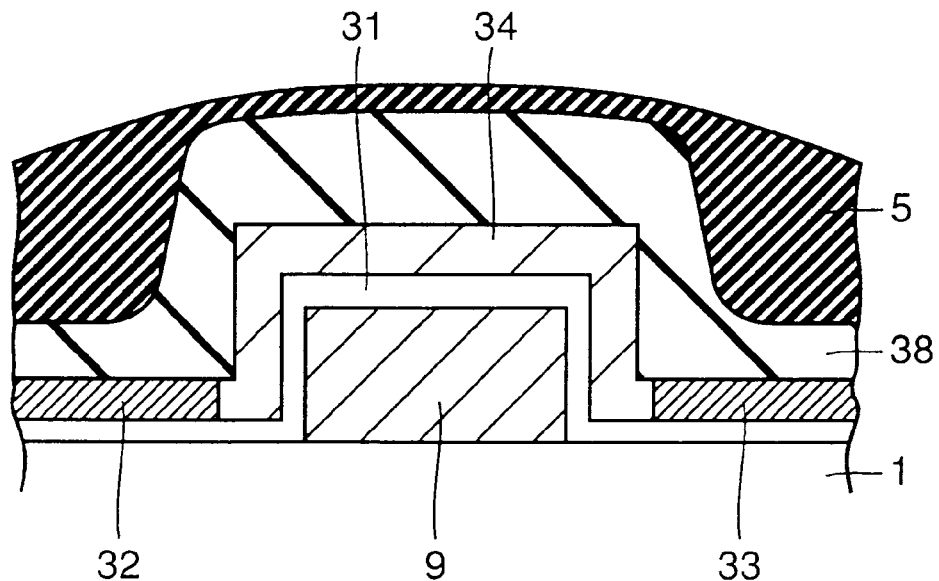
FIG. 20 is a sectional view of an SRAM having an SOG film formed on a TFT of FIG. 18 according to the seventh embodiment of the present invention.
Figure 21:
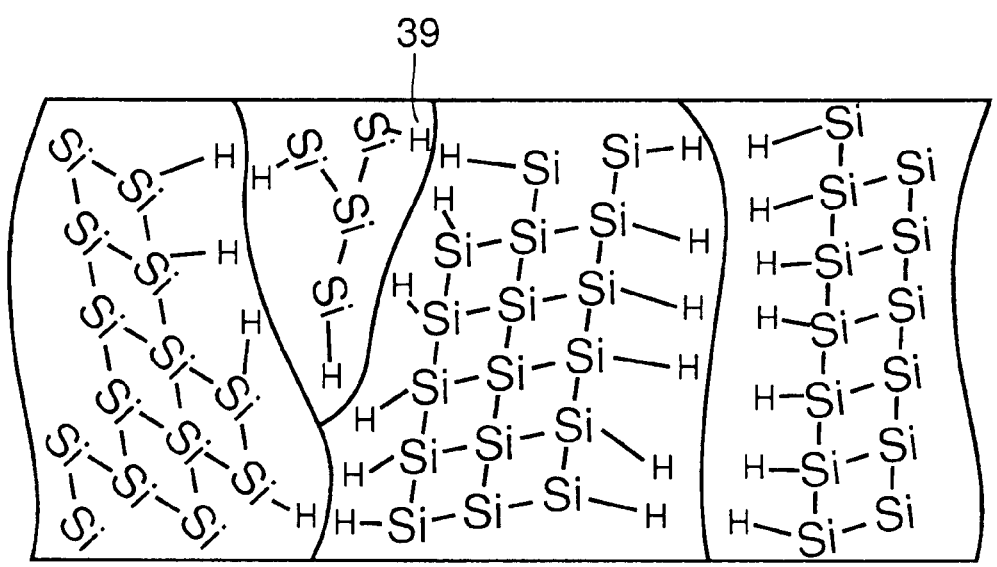
FIG. 21 shows a bonding state of silicon in the polysilicon of FIG. 20 according to the seventh embodiment of the present invention.

Therefore, a thick-film inorganic SOG film 5 is formed on the TFT with a TEOS type silicon oxide film 38 therebetween as shown in FIG. 20. The hydrogen in the thick-film inorganic SOG film couples (39) to the dangling bond in the underlayer TFT formed of polysilicon 34.

The bonding of hydrogen causes reduction in the carriers at the mid gap level to lower the potential barrier and increase the ON current. Furthermore, current generated via the mid gap level can be suppressed to reduce the OFF current.

In fact, in a SRAM including a TFT of 0.6 µm in channel length and 0.8 µm in channel width, ON current was approximately 1 pA and OFF current was approximately 100 fA when a thick-film inorganic SOG film was not applied. In contrast, an ON current of approximately 10 pA and an OFF current of approximately 10 fA was obtained by adapting a thick-film inorganic SOG film to improve the characteristics respectively by one order of magnitude.

The present invention is not limited to an SRAM and can be applied to a DRAM (Dynamic Random Access Memory). By terminating the dangling bond, refresh characteristics such as deferring the interval of a refresh operation for reproducing a memory signal can be improved. Furthermore, junction leakage current of the transistor can be reduced. Thus, a semiconductor device of high performance and high reliability can be obtained.

Although a process of leaving the thick-film inorganic SOG film, i.e., a non-etch back process was described for the above embodiments, an etch back process may be used in order to improve planarization of the device.

Eighth Embodiment

An eighth embodiment of the present invention will be described hereinafter.

Figure 22:
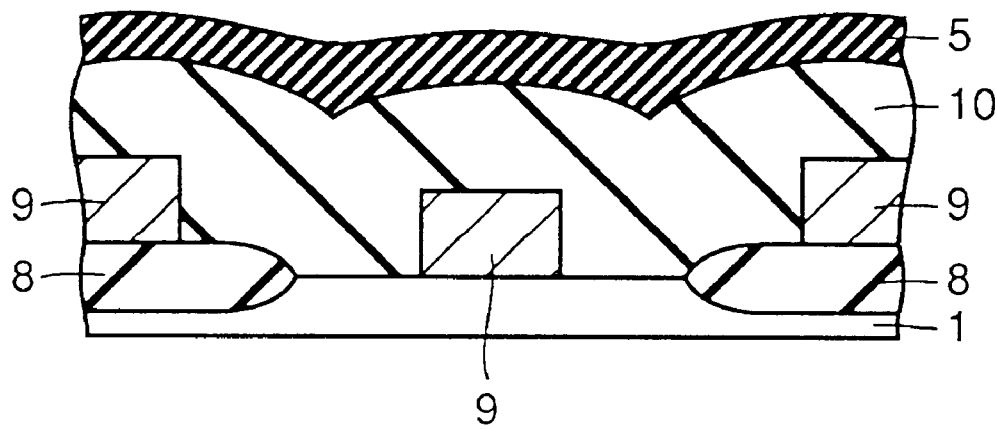
FIG. 22 is a sectional view of a semiconductor device showing a step of a manufacturing method thereof according to an eighth embodiment of the present invention.
Figure 23:
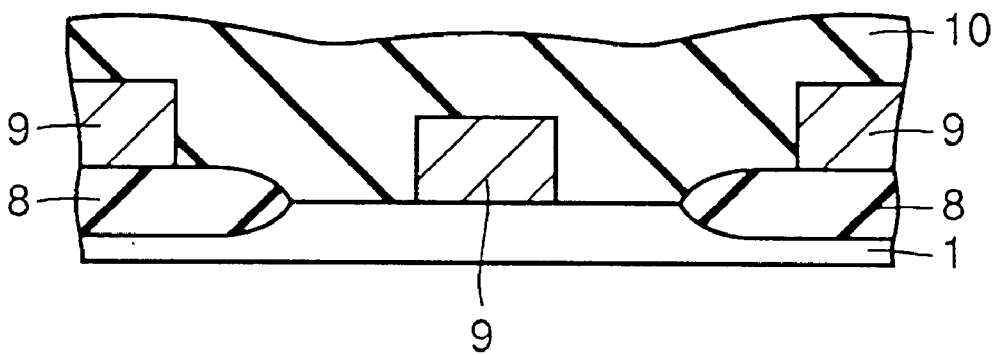
FIG. 23 is a sectional view of a semiconductor device showing a step carried out after the step of FIG. 19 according to the eighth embodiment of the present invention.
Figure 24:
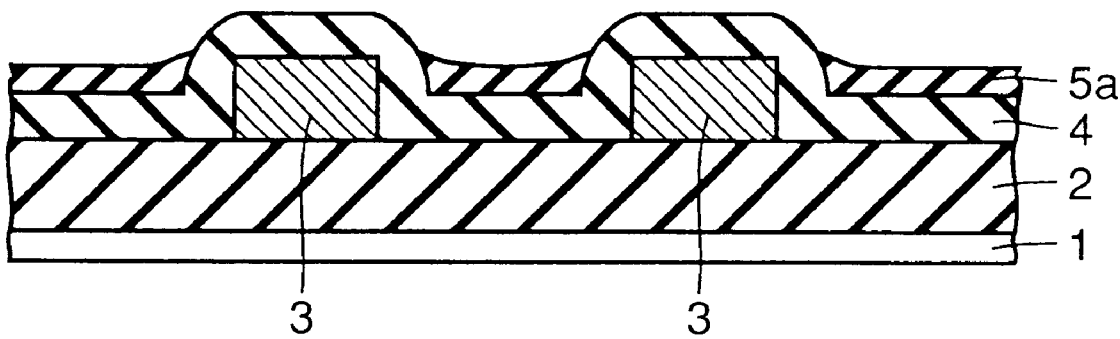
FIG. 24 is a sectional view of a semiconductor device showing a step of an example of a conventional manufacturing method thereof.
Figure 25:
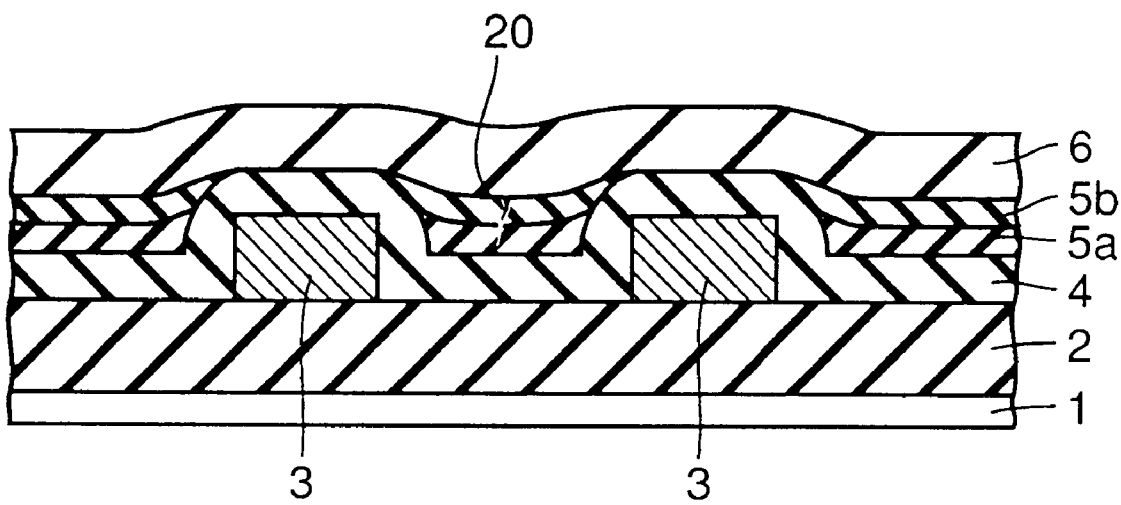
FIG. 25 is a sectional view of a conventional semiconductor device showing a step carried out after the step of FIG. 21.
Figure 26:
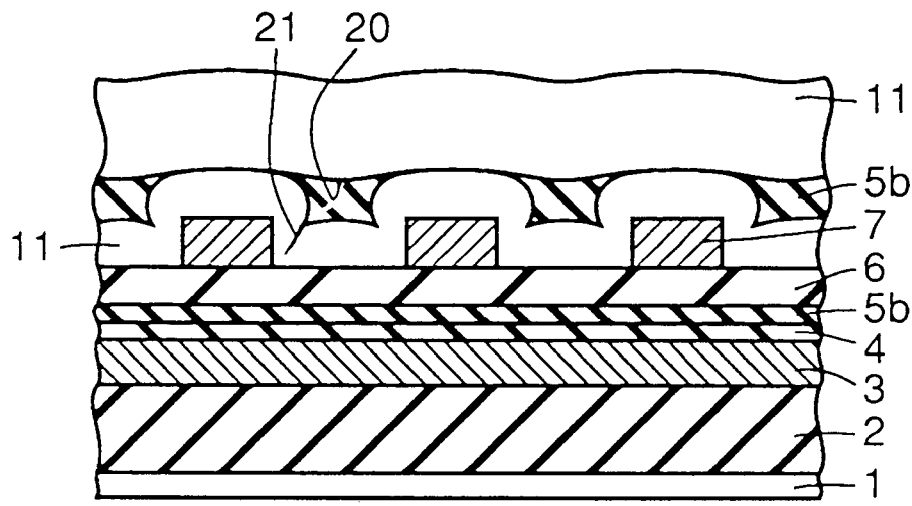
FIGS. 26 and 27 are sectional views of a semiconductor device showing a step of examples of conventional manufacturing methods thereof.
Figure 27:
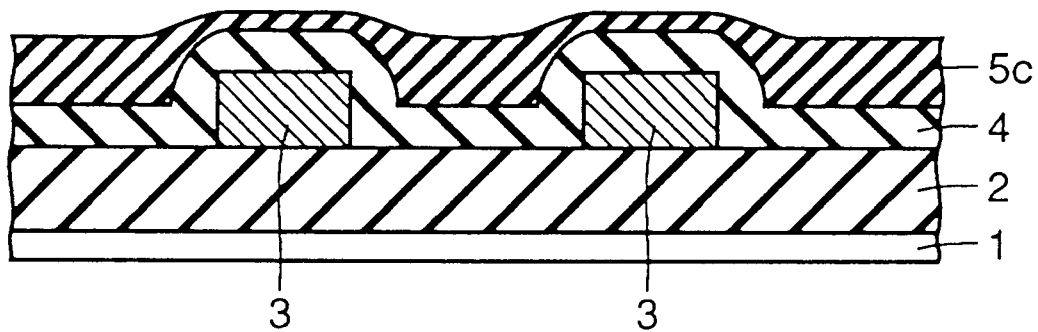
Figure 28:
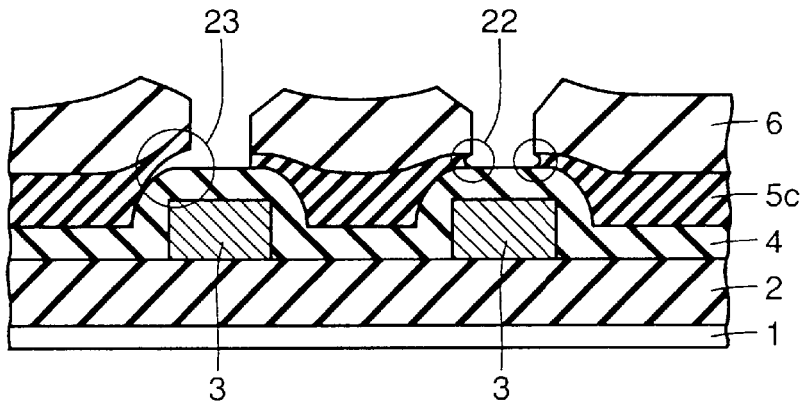
FIGS. 28 and 29 are sectional views of a conventional semiconductor device showing steps carried out after the step of FIG. 24.
Figure 29:
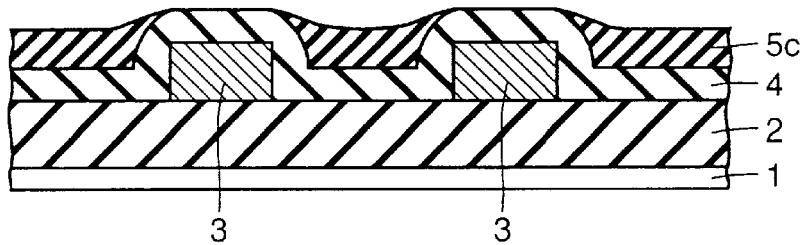
Figure 30:
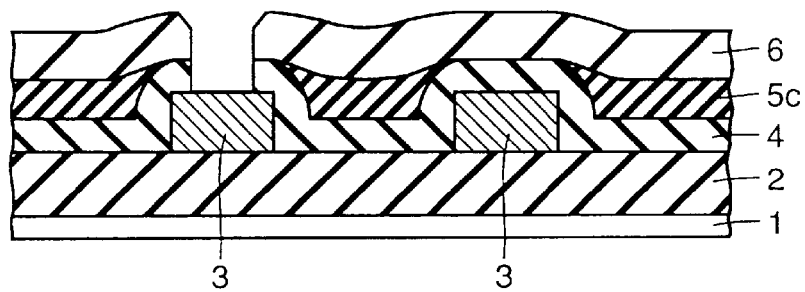
FIG. 30 is a sectional view of a conventional semiconductor device showing a step carried out after the step of FIG. 26.
Figure 31:
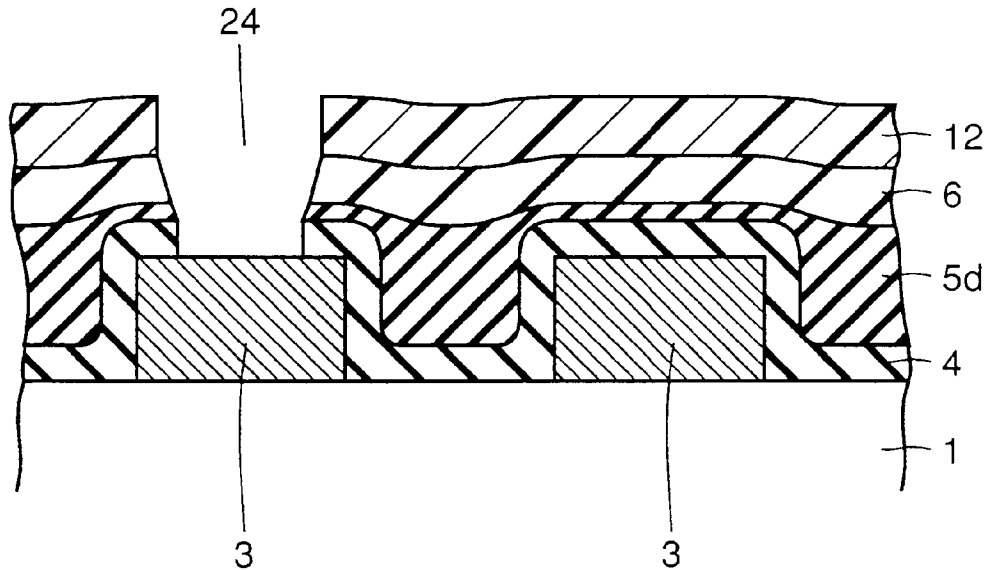
FIG. 31 is a sectional view of a conventional semiconductor device showing a step of another manufacturing method thereof.
Figure 32:
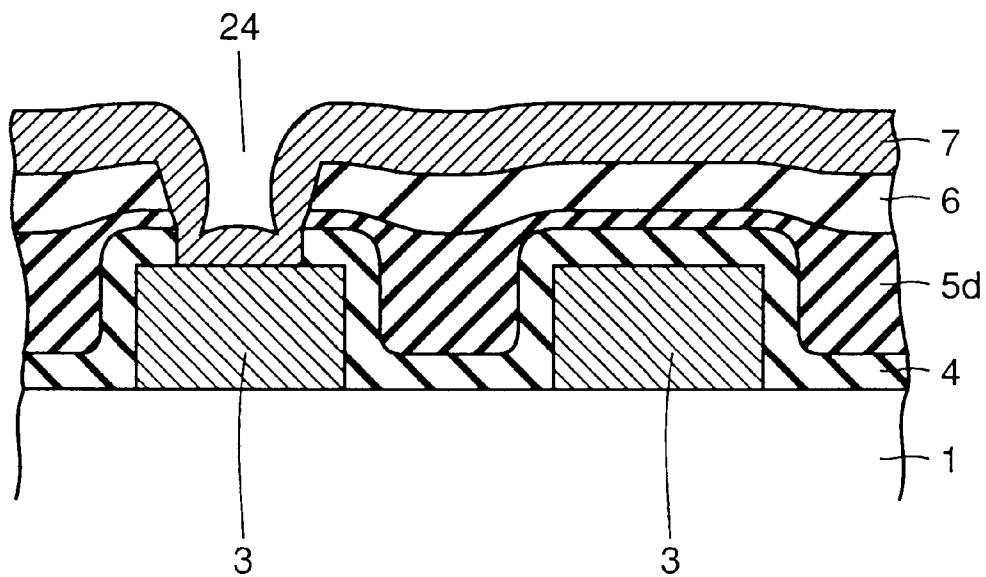
FIG. 32 is a sectional view of a conventional semiconductor device showing a step carried out after the step of FIG. 28 according to a conventional manufacturing method.
Figure 33:
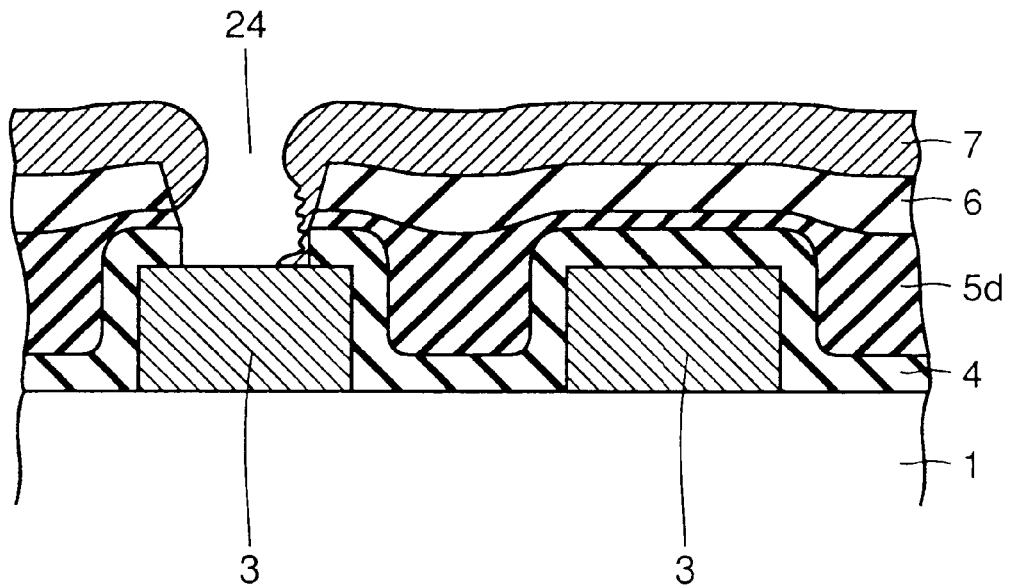
FIG. 33 is a sectional view of a conventional semiconductor device showing a step carried out after the step of FIG. 29 according to the conventional manufacturing method.
Figure 34:
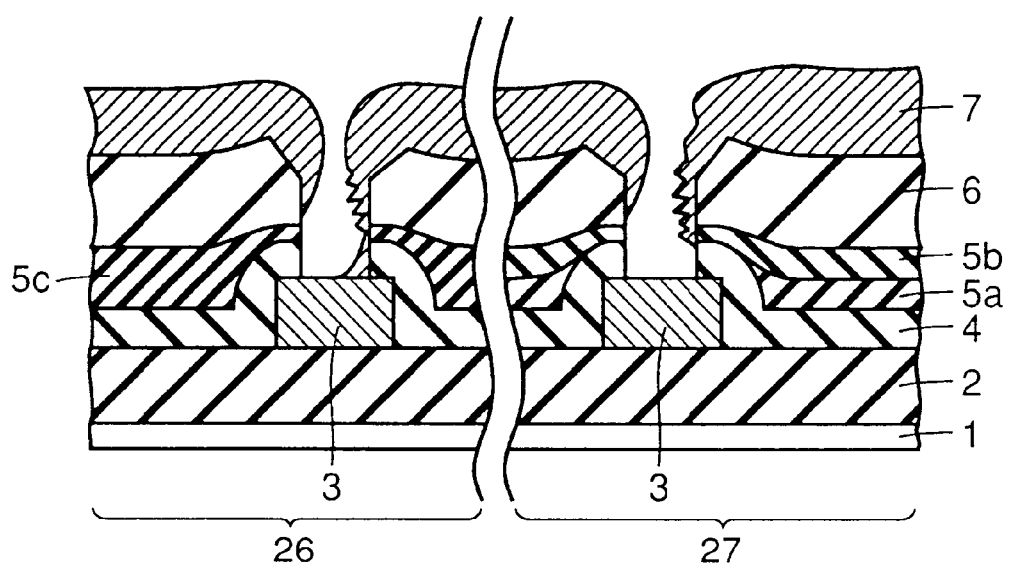
FIG. 34 is a sectional view of a conventional semiconductor device showing a step of another manufacturing method of a semiconductor device.

As shown in FIG. 22, an oxide film 10 is deposited so as to fill an isolation insulator film 8, gate electrode 9 and the like formed on semiconductor substrate 1. Then, a thick-film inorganic SOG film is applied on oxide film 10 and a thermal treatment is carried out to fill the stepped portion of the oxide film. As a result, a SOG film substantially in planarization is formed. Then, the entire surface of the SOG film and the oxide film are etched back anisotropically to remove the SOG film. According to this process, an underlayer reduced in difference in level can be obtained as shown in FIG. 23.

The etching process is not limited to dry etching, and any etching level can be used as long as the etching rate for the SOG film and the oxide film are substantially identical.

Since difference in the underlayer level can be reduced, a predetermined pattern can be formed at high accuracy in a subsequent photolithography step. Thus, a semiconductor device of high reliability can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, which method comprises: depositing an inorganic film, comprising silicon bonded to hydrogen or nitrogen, by a spin-on-glass method on a semiconductor substrate, and then applying a first thermal treatment at a temperature of 300–550° C. in an atmosphere of any of nitrogen, air, or water vapor to form an interlayer film, wherein said inorganic film comprises an inorganic material represented by the formula of:

where x=1–3, y=3–1 and

R is hydrogen atom or lower alkyl group.

2. A method of manufacturing a semiconductor device with a passivation film protecting an element formation region including wiring, said method comprising the steps of:

forming a first protection layer of an inorganic film; and
forming a second protection layer of a material different from that of said inorganic film;

whereby the passivation film is formed including the inorganic film.

3. The method of according to claim 2, wherein the passivation film comprises a silicon nitride film and an inorganic film.

4. The method of manufacturing a semiconductor device according to claim 2, wherein said inorganic film comprises an inorganic material represented by the formula of:

$$S_iH_x(OR)_y$$

where x=1–3, y=3–1, and

R is hydrogen atom or lower alkyl group.

5. The method of manufacturing a semiconductor device according to claim 1, comprising the steps of depositing an interlayer film, comprising said inorganic film, on a semiconductor substrate, forming an opening in said interlayer film, exposing said inorganic film at a sidewall surface of said opening, and then applying a second thermal treatment at a temperature of 150–550° C. and in vacuum at not more than $10^{-3}$ Torr.

6. The method of manufacturing a semiconductor device according to claim 5, comprising the step of carrying out said thermal treatment in a sinter chamber.

7. The method of manufacturing a semiconductor device according to claim 6, wherein a rate of inserting or taking out a semiconductor substrate into or from said sinter chamber is not more than 10 cm/min.

8. The method of manufacturing a semiconductor device according to claim 1, comprising the step of directing nitrogen-containing plasma onto said inorganic film after depositing said inorganic film on said semiconductor substrate.

9. The method of manufacturing a semiconductor device according to claim 1, comprising the step of directing an ultraviolet ray onto said inorganic film after depositing said inorganic film on said semiconductor substrate.

10. A method of manufacturing a semiconductor device, which method comprises: depositing an interlayer film comprising an inorganic film by a spin-on-glass method on a semiconductor substrate; forming an opening in said interlayer film; exposing said inorganic film at a sidewall surface of said opening; and then applying a thermal treatment at a temperature of 150–550° C. and in vacuum at not more than $10^{-3}$ Torr.

11. The method of manufacturing a semiconductor device according to claim 10, comprising the step of carrying out said thermal treatment with a sinter chamber.

12. The method of manufacturing a semiconductor device according to claim 11, wherein a rate of inserting or taking out a semiconductor substrate into or from said sinter chamber is not more than 10 cm/min.

13. A method of manufacturing a semiconductor device, which method comprises: depositing an inorganic silicon film by a spin-on-glass method on a semiconductor substrate; and then directing nitrogen-containing plasma onto said inorganic silicon film.

14. A method of manufacturing a semiconductor device, comprising the steps of coating on a semiconductor substrate an inorganic material represented by the formula of:

$$S_iH_x(OR)_y$$

where x=1–3, y=3–1, and

R is hydrogen atom or lower alkyl group and then applying a heat treatment to form an interlayer film.

15. The method of manufacturing a semiconductor device according to claim 14, comprising the step of adapting said interlayer film for a passivation film.

16. The method of manufacturing a semiconductor device according to claim 14, comprising the step of etching back entirely an underlying surface including said interlayer film after forming said interlayer film on said underlying surface on said semiconductor substrate.

17. A semiconductor device comprising on a semiconductor substrate an inorganic film formed using a first inorganic material represented by the formula of:

$$S_iH_x(OR)_y$$

where x=1–3, y=3–1, and

R is hydrogen atom or lower alkyl group, or a second inorganic material represented by the formula of:

$$-(S_iH_lNH_m)_n-$$

l=1–3, m=0–1
n=20–25000, wherein thermal desorption spectroscopy of the inorganic film does not reveal any substantial desorption gas corresponding to a mass number of 18, 28 and 44.

18. A semiconductor device comprising on a semiconductor substrate an inorganic film formed using a first inorganic material represented by the formula of:

$$S_iH_x(OR)_y$$

where x=1–3, y=3–1, and

R is hydrogen atom or lower alkyl group or a second inorganic material represented by the formula of:

$$-(S_iH_lNH_m)_n-$$

l=1–3, m=0–1
n=20–25000, wherein infrared absorption spectrometry of said inorganic film does not reveal any substantial bonding of a silicon atom and a hydrogen atom at the wave number of 2000–2400 $cm^{-1}$, and bonding of a nitrogen atom and a hydrogen atom at the wave number of 3200–3600 $cm^{-1}$.

* * * * *

UNITED STATES PATENT AND TRADEMARK OFFICE
CERTIFICATE OF CORRECTION

PATENT NO.    : 5,976,626
DATED         : November 2, 1999
INVENTOR(S)   : Junko Matsubara, et a..

It is certified that error appears in the above-identified patent and that said Letters Patent is hereby corrected as shown below:

Add the following two references:
Item [56] References Cited
FOREIGN PATENT DOCUMENTS
90-10933  7/1990   Korea
93-24098  12/1993  Korea Signed and Sealed this Nineteenth Day of June, 2001

*Attest:*

NICHOLAS P. GODICI
*Attesting Officer*     *Acting Director of the United States Patent and Trademark Office*